United States Patent [19]
Katakura

[11] Patent Number: 5,446,409
[45] Date of Patent: Aug. 29, 1995

[54] CROSS COUPLED SYMMETRICAL CURRENT SOURCE UNIT

[75] Inventor: Masayuki Katakura, Kanagawa, Japan

[73] Assignee: Sony Corporation, Japan

[21] Appl. No.: 158,308

[22] Filed: Nov. 29, 1993

[30] Foreign Application Priority Data

Nov. 30, 1992 [JP] Japan .................................. 4-343514
Dec. 15, 1992 [JP] Japan .................................. 4-354665

[51] Int. Cl.[6] .................................................. G05F 1/10
[52] U.S. Cl. ..................................... 327/538; 323/315; 323/316; 330/257
[58] Field of Search ................ 307/292, 455; 323/314, 323/315, 316; 330/257, 288; 327/538, 545

[56] References Cited

U.S. PATENT DOCUMENTS

| | | | |
|---|---|---|---|
| 4,004,247 | 1/1977 | Plassche | 323/315 |
| 4,308,496 | 12/1981 | Nagano | 323/315 |
| 4,588,908 | 5/1986 | Reich et al. | 307/455 |
| 4,791,315 | 12/1988 | Gontowski, Jr. | 307/292 |
| 4,929,910 | 5/1990 | Pace et al. | 330/257 |
| 5,051,621 | 9/1991 | Wright | 307/455 |
| 5,132,640 | 7/1992 | Tanaka et al. | 330/257 |

*Primary Examiner*—Timothy P. Callahan
*Assistant Examiner*—Terry L. Englund
*Attorney, Agent, or Firm*—Ronald P. Kananen

[57] ABSTRACT

A current source circuit has first and second mirror circuits in order to pull currents of equal values into or out of first and second terminals. The potentials at the first and second terminals are maintained equal to each other through the use of the current source circuit. By using an emitter-coupled logic circuit with a simple configuration for detecting the difference between currents, it is possible to produce a small hysteresis voltage with high reliability.

9 Claims, 7 Drawing Sheets

CROSS COUPLED SYMMETRICAL CURRENT SOURCE UNIT

BACKGROUND OF THE INVENTION

1. Field of the Invention

This invention relates to a current source unit, and more particularly is applicable to an emitter-coupled logic circuit constructing for example, a multiplier, an amplifier, or a hysteresis circuit and a differential current detecting circuit.

2. Description of the Related Art

Figure 1:
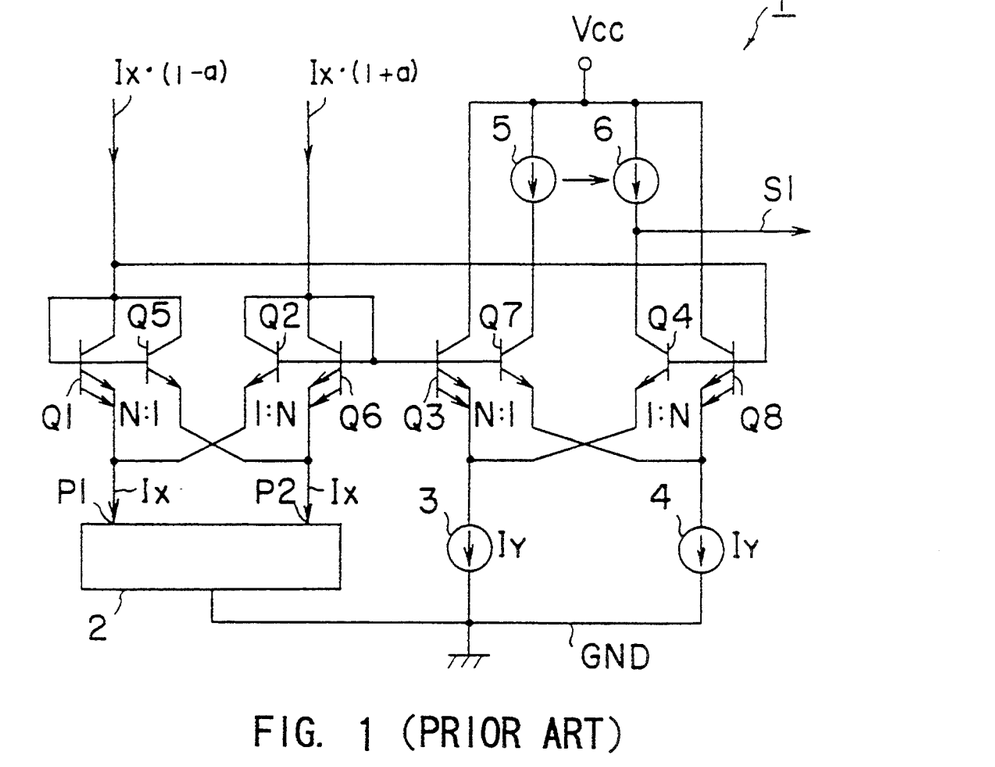
FIG. 1 is a connection diagram explaining a multiplier.
Figure 2:
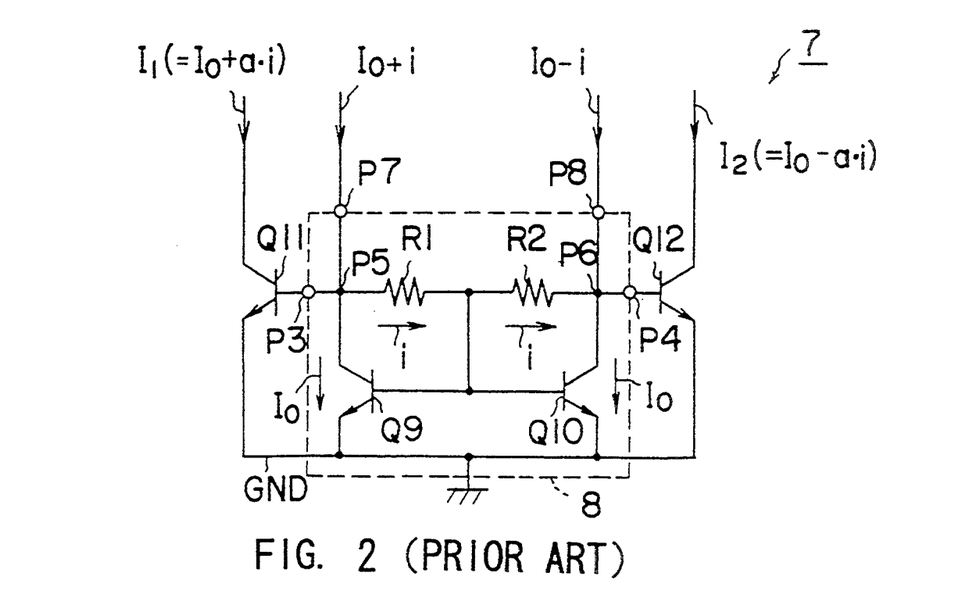
FIG. 2 is connection diagram explaining a differential current amplifier by using a conventional current source.

A current source has been used as an essential component in existing various analog circuits (for example, a multiplier shown in FIG. 1 or a differential amplifier shown in FIG. 2).

Referring to FIG. 1, 1 generally shows a multiplier, including a basic configuration improved from so-called Gilbert cells, which is composed of a pair of diodes and a pair of differential common-emitter units operating in a mode of class AB.

That is, this multiplier is composed of a first and second Gilbert cells in which the first Gilbert cell includes an input stage consisting of a differential pair with diode-connected transistors Q1 and Q2 and includes an output stage consisting of a differential pair with transistors Q3 and Q4 in common-emitter connection. The second Gilbert cell includes an input stage consisting of a differential pair with diode-connected transistors Q5 and Q6 and also including an output stage consisting of a differential pair with transistors Q7 and Q8 in common-emitter connection.

In the input stage, the common emitter of the differential pair of transistors Q1, Q2 and the common emitter of the differential pair of transistors Q5, Q6 are connected to inputs P1 and P2 of a current source 2, respectively. The current source 2 pulls currents $I_x$ into the respective inputs P1 and P2.

In this configuration, the emitter areas of the transistors Q1 and Q6 are N times the emitter areas of the transistors Q5 and Q2, respectively. Therefore, the transistors Q1 and Q6 can have the emitter currents N times larger than the currents in transistors Q5 and Q2.

In the output stage, the common emitter of the differential pair of transistors Q3, Q4 and the common emitter of the differential pair of transistors Q7, Q8 are connected to current sources 3 and 4, respectively. Collectors of transistors Q3 and Q8 are directly connected to a power supply voltage Vcc. Collectors of the transistors Q7 and Q4 are connected to the power supply voltage Vcc via current mirror type of current sources 5 and 6.

Bases of the transistors Q3 and Q7, which are connected together, are connected to a common collector of the transistors Q2 and Q6 in the preceding stage, and bases of the transistors Q4 and Q8, which are connected together, are connected to a common collector of the transistors Q1 and Q5 in the preceding stage. The areas of emitters of the transistors Q3 and Q8 are N times larger than those of the transistors Q7 and Q4.

With this configuration, when a pair of differential currents $I_x.(1+a)$ and $I_x.(1-a)$, including a signal current $a.I_x$ which may be obtained by modulating the current $I_x$ with a modulation factor of "a", are given to the input stage, the output stage provides the output of a signal S1 proportional to the modulation factor "a" via a node connecting the current source 6 and the transistor Q4 together.

A differential current amplifier 7 (FIG. 2) is configured such that the bases of a pair of output transistors Q11 and Q12 are connected to outputs P3 and P4 of a current source 8, respectively.

The current source 8 is configured such that collectors of respective transistors Q9 and Q10 are connected to resistors R1 and R2 at nodes P5 and P6, and a node connecting the resistors R1 and R2 together is connected to the bases of the transistors Q9 and Q10. Furthermore, the node P5 is connected to an input P7 and the output P3 of the current source 8, and the node P6 is connected to an input P8 and the output P4 of the current source 8.

In this circuit configuration, when the inputs P7 and P8 are supplied with a pair of differential currents $I_0+i$ and $I_0-i$ which have superimposed signal currents $i$ and $-i$, respectively, the current source 8 pulls currents $I_0$ into each of the transistors Q9 and Q10 and exhausts these currents to a ground line GND via a common emitter. The current source 8 also makes the signal current $i$ flow through the resistors R1 and R2.

As a result of the operation described above, potential difference is induced across the resistors R1 and R2 (that is, between the outputs P3 and P4), which allows a pair of collector currents $I_1$ and $1I_2$ ($=I_0+a.i$, $I_0-a.i$) including amplified differential currents $a.i$ to flow through the transistors Q11 and Q12, respectively. Thus, the differential current amplifier 7 operates such that it multiplies the signal current $i$ by "a" and it outputs the resultant current.

In the case of the multiplier 1, to provide an appropriate signal output, the current source 2 should operate such that inputs P1 and P2 are maintained at appropriate DC voltages and the current source 2 pulls in the currents $I_x$ having the same value.

Figure 3:
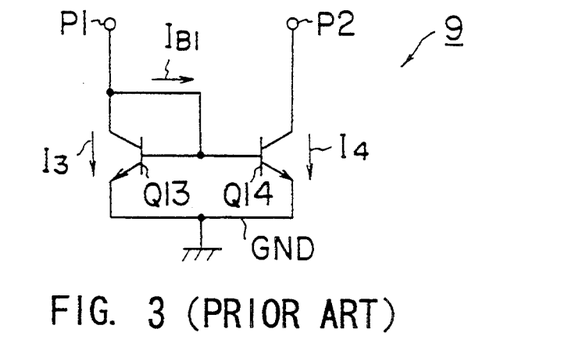
FIG. 3 is a connection diagram explaining the conventional current source.

The most simple example possible of the current source 2 is a current mirror type of current source 9 as shown in FIG. 3.

In this current source 9, the collector currents $I_3$ and $I_4$ of the transistors Q13 and Q14 become approximately the same. However, this type current source has a problem that rigorous equality does not hold between the current into the input P1 and the current into the input P2 due to the fact that a portion of the current to be pulled into the input P1 is spent as a base current $I_{B1}$.

Figure 4:
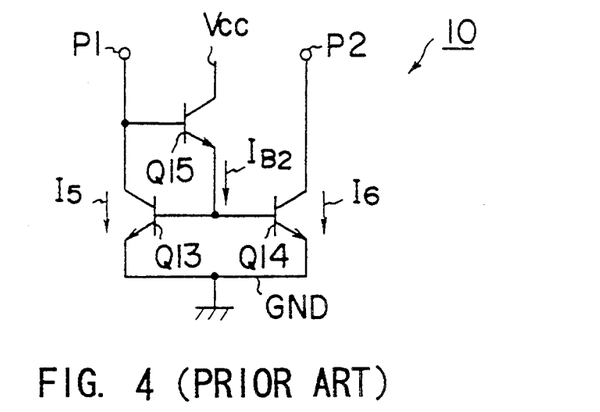
FIG. 4 is a connection diagram explaining the conventional current source.

On the other hand, in the case of the current source 10 shown in FIG. 4, which is obtained by modifying the current source 9 in such a manner that an emitter follower with a transistor Q15 is added to the current source 9, the currents flowing into inputs P1 and P2 can be approximately the same.

However, in the case of the current source 10, the addition of the emitter follower results in a problem that the voltage of the input P1 is increased by $2.V_F$ (where $V_F$ is a forward voltage drop of a semiconductor p-n junction) with respect to a ground line GND, thus reduction occurs in the effective dynamic range.

Figure 5:
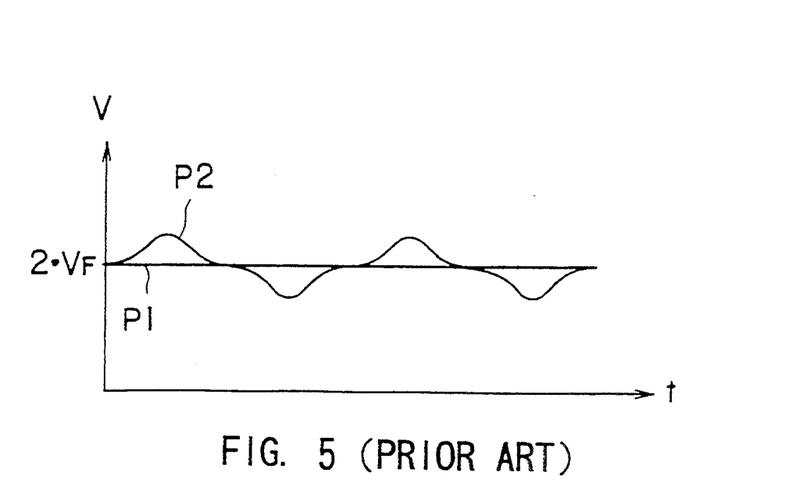
FIG. 5 is a signal wave form diagram explaining change of the potential of input terminals.

To pull the currents $I_x$ into the inputs P1 and P2 by the same amount for both of the inputs P1 and P2, the voltage of the input P2 should be fixed, while the voltage of the input P2 may be an arbitrary value. Therefore, when a pair of differential currents are described by $I_x.(1+a)$ and $I_x.(1-a)$, if the modulation factor $a$ has the form of a sinusoidal wave, then the voltage of the input P1 is fixed at $2.V_F$, while the voltage of the input P1 varies up and down around the $2.V_F$ (FIG. 5). Thus, the voltage variations occur in an asymmetric fashion between the inputs P1 and P2, which leads to a slight problem associate with linearity when the current source is used in a multiplier.

On the other hand, in the case of the current source 8 for use in the differential current amplifier 7, because the bases of a pair of transistors Q9 and Q10 are connected together in common as well as the emitters, the same amount of collector currents $I_0$ flow through each of these transistors Q9 and Q10. Therefore, when a pair of differential currents $I_0+i$ and $I_0-i$ are supplied via the inputs P7 and P8, respectively, the signal currents "i" flow through the resistors R1 and R2, thus resulting in the voltage difference by amount of $(R1+R2).i$ across the resistors R1 and R2 (that is, between the outputs P3 and P4).

Due to this difference in the voltages, the differential current component appears between the collector currents $I_0+a.i$ and $I-a.i$ flowing through the transistors Q11 and Q12, respectively. The differential current component can be described as a function of a resistance R which is the same both for the resistances R1 and R2, a transconductance $g_m$, and a constant $V_T$ by following equation.

$$a \cdot i = g_m \cdot R \cdot i = \frac{I_0}{V_T} R \cdot i \qquad (1)$$

In this equation (1), $V_T$ can be described as $V_T = k.T/q$, where "k" is Boltzmann's constant, "T" is the absolute temperature, and "q" is the electronic charge. Thus, "VT" becomes about 26 mV at room temperature.

As can been seen from the equation (1), to obtain a high gain in this differential current amplifier 7, it is required to use a sufficiently high resistance for the resistors R1 and R2.

However, if the resistances of resistors R1 and R2 are too high, the potentials of the outputs P3 and P4 become too high due to the base currents of the transistors Q9 and Q10 which flow through the resistances R1 and R2. This causes deviations of the operation currents of the transistors Q11 and Q12 from the current $I_0$, which further results in a tendency that the operation current becomes more dependent on the amplification factor $h_{FE}$ and temperature.

Further, in a conventional emitter-coupled logic circuit structuring a hysteresis circuit and a differential current detecting circuit, the hysteresis circuit has been widely used as an effective means for avoiding unwanted phenomenon such as chattering due to noise contained in the input signal, which cannot be removed by a comparator.

Figure 6:
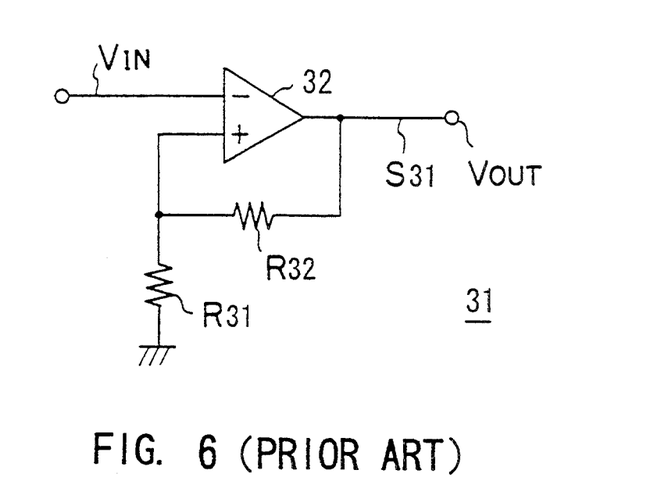
FIG. 6 is a connection diagram illustrating a conventional hysteresis circuit.
Figure 7:
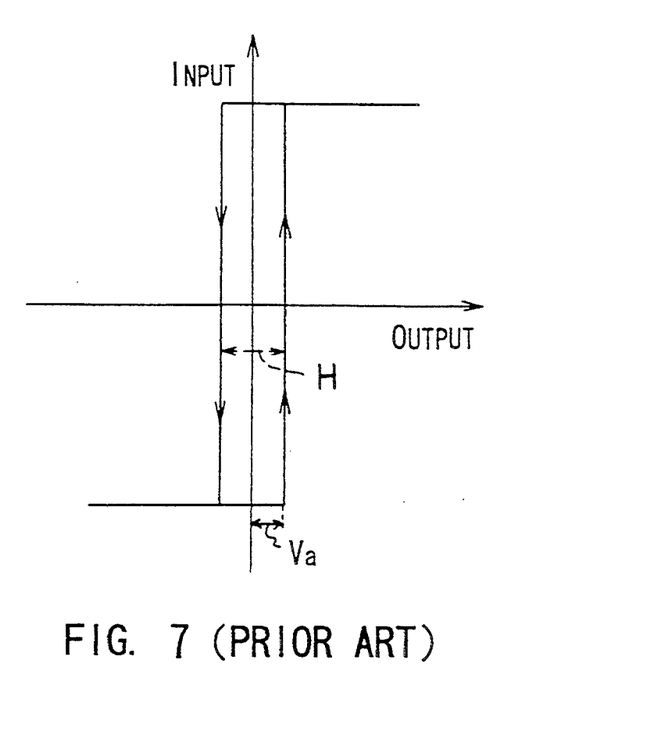
FIG. 7 is a characteristic curve diagram showing hysteresis characteristic of the circuit in FIG. 6.

As shown in FIG. 6, a hysteresis circuit 31 can be configured with an operational amplifier 32 such that noninverting input of the operational amplifier is grounded via a resistor R31, and the output signal S31 of the operational amplifier 32 is fed back as an inverting input to the operational amplifier 32 after being divided with resistors R31 and R32. This configuration gives a typical input-output characteristic as shown in FIG. 7.

In this case, the degree of the hysteresis H of the hysteresis circuit 31 can be determined by an input voltage $V_{IN}$ supplied to the inverting input of the operational amplifier 32 and also by the resistance of the resistors R31 and R32. For example, the voltage Va required for the hysteresis circuit 31 to rise up can be described by the following equation:

$$Va = \frac{V_{IN}}{\left(1 + \frac{R32}{R31}\right)} \qquad (2)$$

relative to the reference voltage (0 V in this case).

As can be seen from this equation (2), the hysteresis circuit 31 does not rise up even if the voltage level associated with the noise component exceeds the reference voltage, as long as the noise level is within a certain range described by the equation (2). Thus, it is possible to avoid chattering in the output signal due to the noise.

However, in general, when it is required to reduce the voltages in a signal processing circuit, a small degree of hysteresis is needed. Therefore, a very large ratio R32/R31 is required in the equation (2), which clearly means that a very large gain and sufficiently large amount of positive feedback are required. A complicated circuit is needed to achieve this requirement.

SUMMARY OF THE INVENTION

In view of the foregoing, an object of this invention is to provide a current source unit in which the currents flowing via two terminals can be maintained equal to each other regardless of the variation in the signal current, and in which there exists a symmetrical relationship between the potentials of two terminals.

The foregoing object and other objects of this invention have been achieved by the provision of a current source unit wherein; there are provided a first current mirror circuit 12 and a second current mirror circuit 13 the first and the second current mirror circuits 12 and 13 are configured such that a first terminal P14 is connected to an output P13 of the first current mirror circuit 12 and also to an input P12 of the second current mirror circuit 13; and a second terminal P11 is connected to an output P10 of the second current mirror circuit 13 and also to an input P9 of the first current mirror circuit 12.

With this arrangement, currents $I_0$ flowing into or out from the first and second terminal P14 and P11 remains constant whatever circuit is connected to the first and second terminals P14 and P11. Also, a symmetrical relationship can be obtained between the potentials of the first and second terminals P14 and P11.

Thus, it becomes possible to avoid the variations of the DC operation point, even in the case where a high gain is required for the current source circuit 11 when it is used as a current source 11 in the amplifier 14. Furthermore, when the current source circuit 11 is used as a current source 2 in the multiplier 1, it becomes possible to avoid a reduction of the dynamic range because there exists a symmetrical relationship between the terminal voltages.

Another object of this invention is to provide an emitter-coupled logic circuit which can produce small hysteresis voltage with a simple circuit configuration with high reliability, which can also be used as a circuit for detecting a current difference.

Furthermore the foregoing object and other objects of this invention have been achieved by the provision of an emitter-coupled logic circuit, comprising: a differential amplifier stage 41 for providing differential currents $I_{30}+\Delta i$ and $I_{30}-\Delta i$ corresponding to the difference in the signal levels of the third and fourth input signals $V_{IN}$ and $V_{REF}$, and a third current source 42 of a current mirror type. A third current output of the differential amplifier stage 41 is connected to a current output of the third current source and a fourth current output of the differential amplifier stage 41 is connected to a current input of the third current source. The third current source 42 pulls in a current $I_{32}$ from the third current output, and the attracted current $I_{34}$ is a predetermined times larger than a current $I_{31}$ flowing into the third current source 42 from the fourth current output. A fourth current source 43 is of current mirror type, wherein the third current output is connected to a current input of the fourth current source 43 and the fourth current output is connected to a current output of the fourth current source 43. The fourth current source 43 pulls in a current $I_{34}$ it from the third current output wherein the current $I_{34}$ pulled in is a predetermined times larger than a current $I_{33}$ flowing into the fourth current source 43 from the fourth current output. When a current $I_{30}+\Delta i$ provided from the third current output becomes a predetermined times larger than a current $I_{30}-\Delta i$ provided from the fourth current output, the fourth current source 43 comes into operation and the third current source 42 stops its operation. When a current $I_{30}-\Delta i$ provided from the fourth current output becomes a predetermined times larger than a current $I_{30}+\Delta i$ provided from the third current output, the fourth current source 43 stops its operation and the third current source 42 comes into operation.

Further in this invention, in an emitter-coupled logic circuit for detecting the difference between third and fourth currents $I_{30}+\Delta i$ and $I_{30}-\Delta i$ provided respectively from third and fourth current outputs of current output stages 53 and 54, the emitter-coupled logic circuit comprises: a third current source 51 of a current mirror type, wherein the third current output is connected to a current output of the third current source 51 and the fourth current output is connected to a current input of the third current source 51. The third current source pulls in a current $I_{41}$ from the first current output, and the pulled-into current $I_{41}$ is equal to a current $I_{40}$ flowing into the third current source 51 from the fourth current output. A fourth current source 52 is of a current mirror type, wherein the third current output is connected to a current input of the fourth current source 52 and the fourth current output is connected to a current output of the fourth current source 52. The fourth current source pulls in a current $I_{43}$ from the fourth current output, and the pulled-into current $I_{43}$ is equal to a current $I_{42}$ flowing into the fourth current source 52 from the third current output. The circuit has a transistor Q44, wherein the third current output is connected to the emitter of the third transistor Q44, and a fourth transistor Q45, wherein the fourth current output is connected to the emitter of the fourth transistor Q45. When the third current $I_{30}+\Delta i$ becomes larger than the fourth current $I_{30}-\Delta i$, the third current source 51 stops its operation and the fourth current source 52 pulls from the fourth transistor Q45 a current corresponding to the difference between the third and fourth currents $I_{30}+\Delta i$ and $I_{30}-\Delta i$. When the fourth current $I_{30}-\Delta i$ becomes larger than the third current $I_{30}+\Delta i$, the fourth current source 52 stops its operation and the third current source 51 pulls from the third transistor Q44 a current corresponding to the difference between the third and fourth currents $I_{30}+\Delta i$ and $I_{30}-\Delta i$.

Furthermore, in this invention, the collectors of third and fourth transistors Q44 and Q45 are connected to each other so as to provide a composite signal at an output composed of the collectors connected to each other. The composite signal being a composite of output signals provided from the collectors of the third and fourth transistors Q44 and Q45.

When a current $I_{30}+\Delta i$ provided from the third current output becomes a predetermined times larger than a current $I_{30}-\Delta i$ provided from the fourth current output, the third current source 42 comes into operation and the fourth current source 43 stops its operation. When a current $I_{30}-\Delta i$ provided from the fourth current output becomes a predetermined times larger than a current $I_{30}+\Delta i$ provided from the third current output, the third current source 42 stops its operation and the fourth current source 43 comes into operation. It is thereby possible to provide voltages with hysteresis via the third and fourth current outputs, and the provided voltages correspond to the current gains of the third and fourth current sources 42 and 43. Thus, by adjusting the current gains of the third and fourth current sources 42 and 43, it is possible to achieve an emitter-coupled logic circuit with a simple configuration which can provide small hysteresis with high reliability.

When the third current $I_{30}+\Delta i$ becomes larger than the fourth current $I_{30}-\Delta i$, the third current source 51 stops its operation and the fourth current source 52 pulls in from the fourth transistor Q45 a current corresponding to the difference between the third and fourth currents $I_{30}+\Delta i$ and $I_{30}-\Delta i$. When the fourth current $I_{30}-\Delta i$ becomes larger than the third current $I_{30}+\Delta i$, the fourth current source 52 stops its operation and the third current source 51 pulls in from the third transistor Q44 a current corresponding to the difference between the third and fourth currents $I_{30}+\Delta i$ and $I_{30}-\Delta i$. It is thereby possible to obtain half-wave difference currents alternately from the collectors of the transistors Q44 and Q45 independently of each other, and the half-wave difference currents correspond to the difference between the output currents $I_{30}+\Delta i$ and $I_{30}-\Delta i$. Thus, it becomes possible to achieve an emitter-coupled logic circuit with a simple configuration capable of providing half-wave difference currents corresponding to the difference between two currents.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Preferred embodiments of this invention will be described with reference to the accompanying drawings:

(1) First Embodiment

Figure 8:
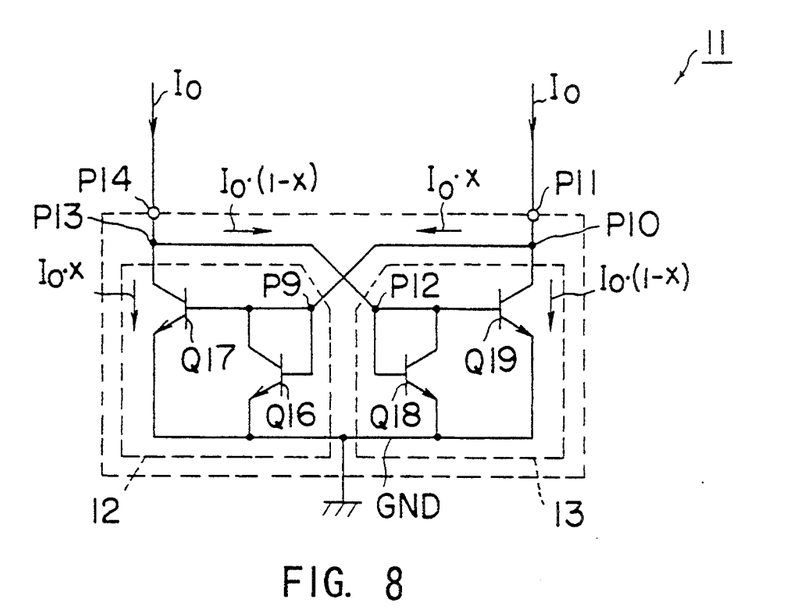
FIG. 8 is a connection diagram showing an embodiment of a current source circuit of this invention.

In FIG. 8, 11 generally shows a current source, which consists of a pair of current mirror circuits 12 and 13. An input P9 of one current mirror circuit 12 is connected to an output P10 of the other current mirror circuit 13 as well as to an input terminal P11 of the current source 11. An input P12 of the current mirror circuit 13 is connected to an output P13 of the current mirror circuit 12 as well as to an input terminal P14 of the current source 11.

In the above configuration, if a current $I_0$ is supplied to each of the inputs P11 and P14 and if thus a current $I_0 \cdot x$ flows through a transistor Q16, then the same amount of collector current $I_0 \cdot x$ flows through a transistor Q17. In this situation, a current $I_0 \cdot (1-x)$ flows through a transistor Q18. As a result, the same amount collector current $I_0 \cdot (1-x)$ flows through a transistor Q19.

The current source 11 has symmetry between the circuit configuration seen from the input P11 and that seen from the input P14. As a result, the relationships regarding the currents described above hold for both the cases where the current source 11 is seen from the input P11 and where it is seen from the input P14. Therefore, the current source pulls the same amount of current $I_0$ into both of the inputs P11 and P14, and thus the currents pulled into the inputs P11 and P14 change with maintaining symmetry.

In this current source 11, because DC potentials of the inputs P11 and P14 with respect to a ground line GND become equal to base-to-emitter voltages (that is $V_F$) of the transistors Q16 and Q18, respectively, and because there exists symmetry between the circuit configuration seen from the input P11 and that seen from the input P14, the potentials at inputs P11 and P14 change in a symmetrical fashion.

Therefore, when the current source 11 is used as a current source 2 in a multiplier 1 of FIG. 1, perfect equality holds between the currents pulled into the inputs P11 and P14 without asymmetrical variations in the potentials at P11 and P14 as opposed to the case of FIG. 3. In addition, no reduction occurs in the dynamic range as opposed to the current source 10 shown in FIG. 4.

With the above arrangement, it becomes possible to obtain a signal S1 from the multiplier in which the signal S1 is more accurately proportional to the signal current $a \cdot I_x$.

(2) Second Embodiment

In the embodiment described above, the current source 11 is used as a current source 2 in a multiplier. However, this invention is not only limited to this, but the current source could be used in a differential current amplifier.

Figure 9:
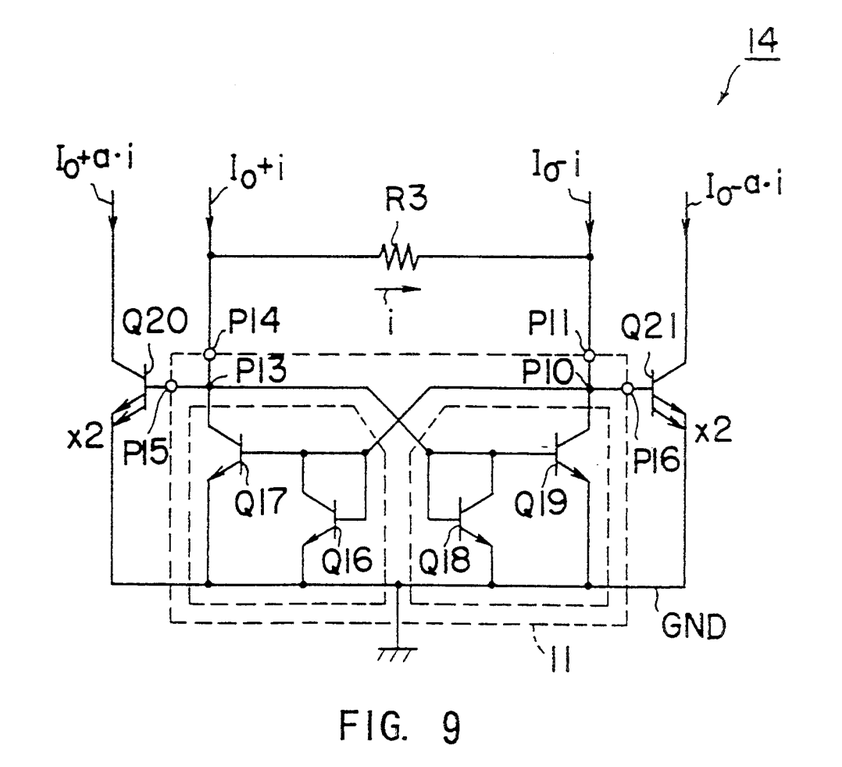
FIG. 9 is a connection diagram showing a differential current amplifier using the current source circuit of this invention.

In this case, as shown in FIG. 9, the differential current amplifier 14 is constructed in such a manner that a resistor R3 is connected between the inputs P14 and P11 of the current source 11. The outputs P15 and P16 of the current source 11, which are connected to the outputs P13 and P10, respectively, are connected to respective bases of transistors Q20 and Q21.

In this configuration, if a pair of differential currents $I_0 + i$ and $I_0 - i$ including a signal current "i" are given to the differential current amplifier 14, then it pulls only the current components 10 into the outputs P13 and P10 and exhausts them to a ground line GND, while the current component "i" flows through the resistor R3.

As a result, a potential difference is produced across the resistor R3 (that is, between the outputs P15 and P16). Furthermore, via the collectors of the transistors Q20 and Q21, differential currents $I_0 + a \cdot i$ and $I_0 - a \cdot i$ flow which include the difference current component $a \cdot i$, wherein the difference current component $a \cdot i$ is amplified in proportion to the signal current "i".

The base currents of the transistors Q16 and Q18 which affect the potentials of the outputs P15 and P16 are directly given via the inputs P11 and P14 without passing through the resistor R3. As a result, when the signal current "i" is not supplied, the potentials of the outputs P15 and P16 are maintained at a constant value which is the same for both the outputs P15 and P16 regardless of the resistance of the resistor R3.

Thus, even if a high resistance is employed for the resistor R3 to obtain a high gain, it does not affect the DC operation point of the transistors Q20 and Q21. Therefore, it becomes possible to more flexibly design the gain of the differential current amplifier 14. Thus it becomes possible to obtain a higher gain.

Furthermore, whatever high value the input current $I_0$ has, the potentials of the outputs P15 and P16 are maintained at a constant value which is the same for both the outputs P15 and P16 as long as the signal current "i" is not supplied. Thus the bases of the transistors Q20 and Q21 become the same in potential. Therefore, it becomes easy to design the value of the currents $I_0$ which flow through the transistors Q20 and Q21.

While this invention has been described with reference to specific embodiments associated with a multiplier 1 and differential current amplifier 14, this invention is not limited to these embodiments, but may also be applied to a variety of analog circuits including a current source.

In the embodiments described above, the current mirror circuits 12 and 13 of the current source 11 are configured with NPN transistors Q16 to Q19 to pull in a predetermined currents. However, this invention is not only limited to this, but the current mirror circuits may also be configured with PNP transistors to exhaust predetermined currents.

In the embodiments described above, the current mirror circuits 12 and 13 of the current source 11 are respectively configured with two NPN transistors of Q16 to Q19. However, this invention is not only limited to this, but each current mirror circuit may also be configured with three or more PNP transistors.

As described above, with this invention, it is possible to maintain constant values of currents which flow into or out of first and second terminals to which the inputs and outputs of a current, for source are connected whatever circuit is connected to the first and second terminals. It also becomes possible to realize a current source circuit in which the potentials of the first and second terminals are maintained equal to each other.

Thus, the current source circuit in accordance with this invention can be used as a current source in an amplifier in which a high gain is required, without variations in the DC operation point. The current source in accordance with this invention can also be used as a current source for a multiplier without a reduction in the dynamic range because of symmetry in terminal voltages.

Further, the above current source can be applied to an emitter-coupled logic circuit.

(3) Third Embodiment

Figure 10:
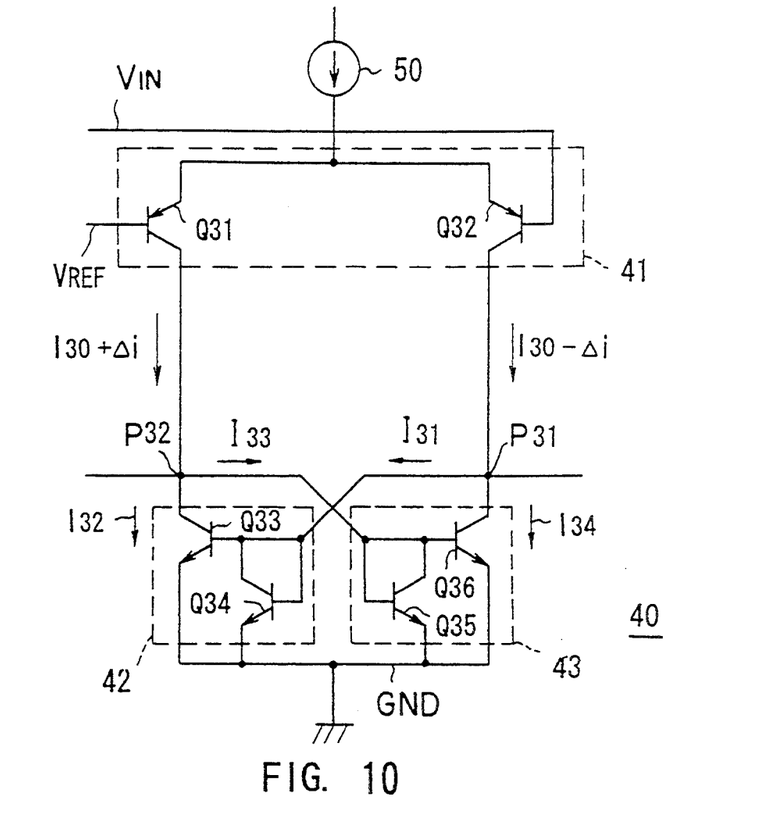
FIG. 10 is a connection diagram illustrating an embodiment of a hysteresis circuit using an emitter-coupled logic circuit of this invention.

In FIG. 10, 40 generally shows a hysteresis circuit, in which a differential input circuit 41 provides currents to respective two sets of current mirror circuits 42 and 43 with cross connection.

In the differential input circuit 41. The emitters connected to each other of a differential pair of transistors Q31 and Q32 are connected to a current source 50 which supplies with a predetermined bias voltage, and predetermined reference voltage $V_{REF}$ and input voltage $V_{IN}$ are supplied to the bases of the transistors Q31 and Q32, respectively. The difference current is provided between a third current output comprising a collector of the transistor Q31 and a fourth current output consisting of a collector of the transistor Q32 in which the difference current corresponds to the difference between the input voltage $V_{IN}$ and the reference voltage $V_{REF}$.

The third current mirror circuit 42 consist of a pair of transistors Q33 and Q34, in which a current input composed of the node of the base and the collector of the transistor Q34 and the base of the transistor 33, is connected to the output of the fourth current output of the differential input circuit 41. The current output consisting of a collector of the transistor Q33 is connected to the third current output of the differential input circuit 41.

In this configuration, the third current mirror circuit 42 is formed such that the emitters of the transistors Q33 and Q34 are connected to a ground line GND and the emitter of the transistor Q33 has an area N (N≧1) times larger than that of the transistor Q34, so that the transistor Q33 pulls a current $I_{32}$ into via a node P32, where the amount of the current flowing into the transistor Q33 is N times larger than the current $I_{31}$ flowing into the transistor Q34 via a node P31. As a result, current gain as much as N can be obtained in the third current mirror circuit 42.

Similarly, the fourth current mirror circuit 43 consists of a pair of transistors Q35 and Q36, in which a current input composed of connection of the base and the collector of the transistor Q35 and the base of the transistor Q36, is connected to the output at the node P32 of the third current output of the differential input circuit 43.

The current output consisting a collector of the transistor Q36 is connected to the fourth current output of the differential input circuit 41 at the node P31.

In this configuration, the fourth current mirror circuit 43 is formed such that the emitters of the transistors Q35 and Q36 are connected to the ground line GND and the emitter of the transistor Q36 has an area N (N≧1) times larger than that of the transistor Q35, so that the transistor Q36 pulls a current $I_{34}$ into via the node P31, where the amount of the current flowing into the transistor Q36 is N times larger than the current $I_{33}$ flowing into the transistor Q35 via the node P32. Thus, the current gain as much as N can also be obtained in the fourth current mirror circuit 43.

In the configuration described above, the currents provided from the differential input circuit 41 to the node P31 and the node P32 (hereinafter, the current will be denoted by difference current) can be described as $I_{30}-\Delta i$ and $I_{30}+\Delta i$, respectively, where $I_{30}$ is the collector current obtained when the input voltage $V_{IN}$ is equal to the reference voltage $V_{REF}$, $\Delta i$ is the variation of the current $I_{30}$ induced by the variation in the input voltage $V_{IN}$.

If the input voltage $V_{IN}$ is small enough relative to the reference voltage $V_{REF}$, then $\Delta i$ becomes large with a negative sign, thus the difference current $I_{30}+\Delta i$ becomes sufficiently small and the difference current $I_{30}-\Delta i$ becomes sufficiently large.

As a result, even if the entire difference current $I_{30}+\Delta i$ flowing via the node P32 is provided to the fourth current mirror circuit 43, the fourth current mirror circuit 43 cannot accept all the difference current $I_{30}-\Delta i$ flowing via the node P31. Thus, overflowed current $I_{31}$ is forced to flow into the third current mirror circuit 42.

As a result, the third current mirror circuit 42 tries to accept the current $I_{32}$ which is N times larger than the current $I_{31}$. Thus the entire current flowing into the node P32 is pulled into the third current mirror circuit 42. Thus, the current $I_{33}$ is no longer supplied to the fourth current mirror circuit 43, and the fourth current mirror circuit 43 becomes cut off.

Therefore, the current $I_{33}$ flowing into the fourth current mirror circuit 43 via the node P32 in this situation can be given by following equation:

$$I_{33}=0 \tag{3}$$

On the other hand, the current $I_{31}$ flowing into the third current mirror circuit 42 via the node P31 can be given by following equation:

$$I_{31}=I_{30}-\Delta i \tag{4}$$

If the input voltage $V_{In}$ rises gradually from this situation, correspondingly $\Delta i$ also rises gradually.

Therefore, in this case, the difference current $I_{30}+\Delta i$ supplied to the node P32 increases while the difference current $I_{30}-\Delta i$ supplied to the node P31 decreases.

As a result, the current $I_{31}$ flowing into the third current mirror circuit 42 via the node P31 decreases and corresponding to that the current which the third current mirror circuit 42 can accept via the node P32 decreases.

The difference current $I_{30}+\Delta i$ provided to the node P32 can be equal to the current which the third current mirror circuit 42 can pull into, when meeting the following equation:

$$I_{30}+\Delta i = N \times (I_{30}-\Delta i) \quad (5)$$

that is, when the difference current $I_{30}+\Delta i$ is equal to N times the current $I_{31}$ (equal to $I_{30}-\Delta i$ in this case). Therefore, when the input voltage $V_{In}$ becomes larger than a value of $\Delta i$ described by the following equation:

$$\Delta i = \frac{N-1}{N+1} \times I_{30} \quad (6)$$

which is the solution obtained by solving the equation (5) with respect to $\Delta i$ (hereinafter, this special value of $\Delta i$ will be referred to as "falling threshold voltage $V_{INDOWN}$), the third current mirror circuit 42 can no longer accept all of the difference current $I_{30}+\Delta i$ supplied to the node P32 and the current $I_{33}$ overflows into the fourth current mirror circuit 43.

As a result, the fourth current mirror circuit 43 pulls in a current $I_{34}$ which is N times larger than the current $I_{33}$, and thus reduction occurs in the current $I_{31}$ flowing into the third current mirror circuit 42 via the node P31. Correspondingly, a reduction also occurs in the current $I_{32}$ that the third current mirror circuit 42 pulls. As a result of this, an increase occurs in the current $I_{33}$ flowing into the fourth current mirror circuit 43 via the node P32.

Ultimately, the entire difference current $I_{30}+\Delta i$ supplied to the node P32 comes to flow into the fourth current mirror circuit 43 and the entire difference current $I_{30}-\Delta i$ supplied to the node P31 comes to be pulled into the fourth current mirror circuit 43. Thus a transition occurs in the state and the third current mirror circuit 42 becomes cut off.

In this situation, the current $I_{31}$ flowing from the node P31 into the third current mirror circuit 42 is given by following equation:

$$I_{31}=0 \quad (7)$$

On the other hand, the current $I_{33}$ flowing from the node P32 into the fourth current mirror circuit 43 is given by following equation:

$$I_{33}=I_{30}+\Delta i \quad (8)$$

In this hysteresis circuit 40, if the input voltage $V_{In}$ is decreased from this situation, an immediate supply of the current $I_{32}$ to the third current mirror circuit 42 does not occur.

That is, if the input voltage $V_{In}$ is decreased from this situation, then $\Delta i$ also decreases. Therefore, the difference current $I_{30}-\Delta i$ flowing into the node P31 increases. In contrast, the difference current $I_{30}+\Delta i$ flowing into the node P32 decreases.

In this case, the difference current $I_{30}-\Delta i$ flowing into the node P31 can be equal to the current which the fourth current mirror circuit 43 can pull into, when meeting the following equation:

$$I_{30}-\Delta i = N \times I_{33} N \times (I_{30}+\Delta i) \quad (9)$$

That is, the difference current $I_{30}-\Delta i$ is equal to N times the current $I_{33}$ (equal to $I_{30}+\Delta i$ in this case) flowing into the fourth current mirror circuit 43 via the node P32. Therefore, when the input voltage $V_{In}$ becomes less than a value of $\Delta i$ described by following equation:

$$\Delta i = -\frac{N-1}{N+1} \times I_{30} \quad (10)$$

which is the solution obtained by solving the equation (9) with respect to $\Delta i$ (hereinafter, this special value of $\Delta i$ will be referred to as "rising threshold voltage $V_{INUP}$), the current $I_{31}$ flows into the third current mirror circuit 42. In an absolutely opposite way to the above case, the fourth current mirror circuit 43 becomes cut off and a transition state occurs.

In the above operation, when, for example, the third current mirror circuit 42 is cut off, the transistor Q36 becomes saturated and the voltage drop across it becomes low. As a result, the node P31 is maintained low in potential. Hereinafter, this potential will be referred to as "low level potential $V_{LOW}$".

In contrast, when the fourth current mirror circuit 43 is cut off, the base-to-emitter voltage of the transistor Q34 is maintained constant regardless of the amount of the current $I_{31}$. Therefore, in this case, the node P31 is maintained at a constant voltage which is equal to the base-to-emitter voltage of the transistor Q34 and which is higher than the low level potential $V_{LOW}$. Hereinafter, this specific voltage will be referred to as "high level potential $V_{HI}$.

Figure 11:
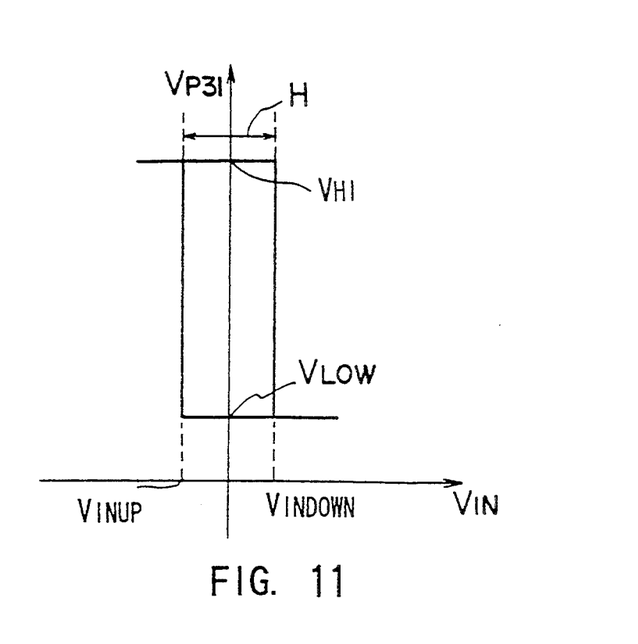
FIG. 11 is a characteristic curve diagram illustrating a change of the potential of one node by the changing of an input voltage for the circuit of FIG. 10.

When the input voltage $V_{IN}$ rises gradually starting from a value significantly smaller than the reference voltage $V_{REF}$, the voltage $V_{p31}$ of the node P31 maintained at the high level potential $V_{HI}$ regardless of the input voltage $V_{IN}$ as shown in FIG. 11, because the fourth current mirror circuit 43 is cut off in the initial state. When the input voltage $V_{IN}$ reaches falling threshold voltage $V_{INDOWN}$, the transition state occurs and the third current mirror circuit 42 becomes cut off. Thus, the voltage $V_{p31}$ turns into the low level potential $V_{LOW}$. After that, the voltage $V_{p31}$ is maintained at the low level potential $V_{LOW}$ regardless of the magnitude of the input voltage $V_{IN}$.

When the input voltage $V_{IN}$ falls gradually from this situation the voltage of the node P31 maintained at the low level potential $V_{LOW}$ regardless of the input voltage $V_{IN}$, because the third current mirror circuit 42 is cut off. When the input voltage $V_{IN}$ reaches the rising threshold voltage $V_{INUP}$, the transition state occurs and the fourth current mirror circuit 43 becomes cut off. Thus, the voltage of the node P31 turns into the high level potential $V_{HI}$. After that, the voltage of the node P31 is maintained at the high level potential $V_{HI}$ regardless of the magnitude of the input voltage $V_{IN}$.

Thus, in this hysteresis circuit 40, when the node P31 is used as an output, such hysteresis is characterized by following equation:

$$H = \pm \frac{N-1}{N+1} \times I_{30} \quad (11)$$

can be obtained wherein the hysteresis H depends on the current gains of the third and fourth current mirror circuits 42 and 43.

Similarly, the node P32 is maintained at the high level potential $V_{HI}$ regardless of the input voltage $V_{IN}$ when the third current mirror circuit 42 is cut off, and it is maintained at the low level potential $V_{LOW}$ regardless of the input voltage $V_{IN}$ when the fourth current mirror circuit 43 is cut off.

Figure 12:
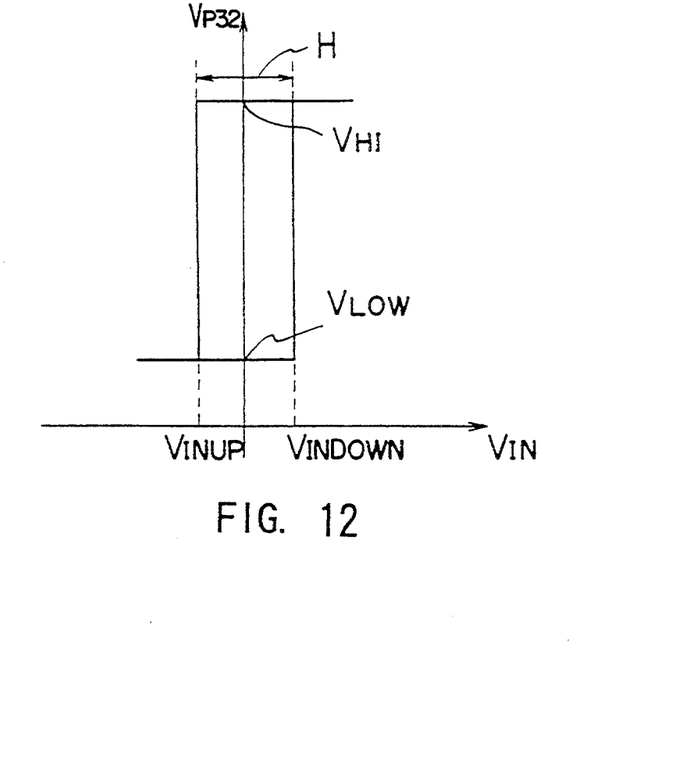
FIG. 12 is a characteristic curve diagram illustrating a change of the potential of one node by the changing of the input voltage for the circuit of FIG. 10.

Therefore, when the input voltage $V_{IN}$ rises gradually starting from a value significantly smaller than the reference voltage $V_{REF}$, the voltage $V_{p32}$ of the node P32 is maintained at the low level potential $V_{LOW}$ regardless of the input voltage $V_{IN}$ as shown in FIG. 12, because the fourth current mirror circuit 43 is cut off. When the input voltage $V_{IN}$ reaches the falling threshold voltage $V_{INDOWN}$, the state transition occurs and the third current mirror circuit 42 becomes cut off. Thus, the voltage $V_{p32}$ turns into the high level potential $V_{HI}$. After that the voltage $V_{p31}$ is maintained at the high level potential $V_{HI}$ regardless of the magnitude of the input voltage $V_{IN}$.

When the input voltage $V_{IN}$ falls gradually from this situation, the voltage of the node P32 is maintained at the high level potential $V_{HI}$ regardless of the input voltage $V_{IN}$, because the third current mirror circuit 42 is cut off. When the input voltage $V_{IN}$ reaches the rising threshold voltage $V_{INUP}$, the transition state occurs and the fourth current mirror circuit 43 becomes cut off. Thus, the voltage of the node P32 turns into the low level potential $V_{LOW}$. After that, the voltage of the node P32 is maintained at the low level potential $V_{LOW}$ regardless of the magnitude of the input voltage $V_{IN}$.

Thus, in this hysteresis circuit 10, when the node P32 is used as an output, such hysteresis characteristics with hysteresis H as shown in the equation (11) can be obtained when node P31 is used as an output.

Calculation shows that when the third and fourth current gains N are 1.5, the magnitude of the hysteresis of this hysteresis circuit 40 becomes $\pm 0.2 I_{30}$ and thus a small hysteresis, such as $\pm 10$ mV can be obtained. When the third and fourth current gains N are 2.0, the magnitude of the hysteresis of the hysteresis circuit 40 becomes $\pm 0.33 I_{30}$ and thus, in this case, a small hysteresis, such as $\pm 18$ mV can be obtained.

With the configuration described above, the current output of the third current mirror circuit 42 and the current input of the fourth current mirror circuit 43 are connected to the third current output of the differential input circuit 41. Furthermore the current input of the third current mirror circuit 42 and the current output of the fourth current mirror circuit 43 are connected to the fourth current output of the differential input circuit 41. If the current $I_{30}+\Delta i$ provided from the third current output of the differential input circuit 41 becomes larger than N times the current $I_{30}-\Delta i$ provided from the fourth current output of the differential input circuit 41, then the third current mirror circuit 42 becomes cut off and the fourth current mirror circuit 43 comes into operation. On the other hand, if the current $I_{30}-\Delta i$ provided from the fourth current output of the differential input circuit 41 becomes larger than N times the current $I_{30}+\Delta i$ provided from the third current output of the differential input circuit 41, then the fourth current mirror circuit 43 becomes cut off and the third current mirror circuit 42 comes into operation. In this way, nodes P31 and P32 provide hysteresis characteristics depending on the current gains N of the third and fourth current mirror circuits 42 and 43. Thus, a small hysteresis voltage can be achieved with a simple circuit configuration and with high reliability.

(4) Fourth Embodiment

Figure 13:
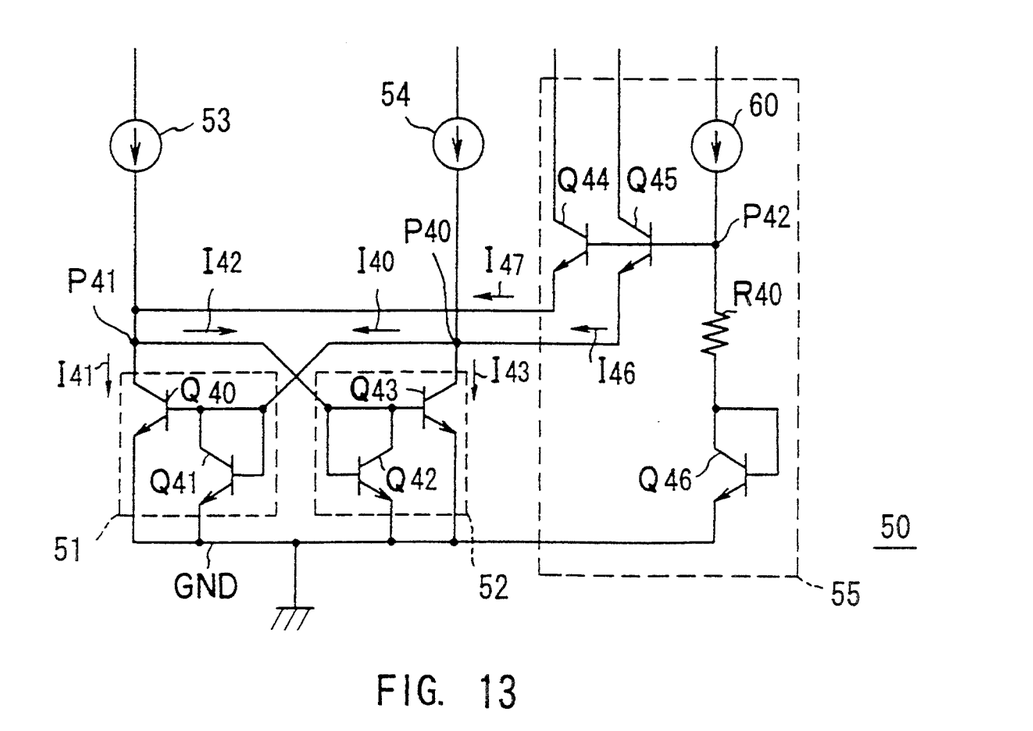
FIG. 13 is a connection diagram showing an embodiment of a differential current detecting circuit using the emitter-coupled logic circuit of this invention.

IN FIG. 13, 50 generally shows a difference current detecting circuit in which a fifth and sixth current mirror circuits 51 and 52 detect the difference between the currents supplied from third and fourth current sources 53 and 54 and provide the resultant output via an output circuit 55.

In the fifth current mirror circuit 51 consisting of a pair of transistors Q40 and Q41, a current output formed at the collector of the transistor Q40 is connected to the third current source 53. A current input, which is formed at of the base of the transistor Q40 and the base and collector of the transistor Q41, is connected to the fourth current source 54.

In this configuration, respective emitters of the transistors Q40 and Q41 are connected to a ground line GND and the emitter of the transistor Q40 has the same area as that of the transistor Q41, so that the transistor Q40 can pull in the same current as the current which flows through the transistor Q41. Thus the fifth current mirror circuit 51 can pull in via a node P41 a current $I_{41}$ equal to the current $I_{40}$ supplied via a node P40 connecting the fourth current source 54 to the sixth current mirror circuit 52.

Similarly, in the sixth current mirror circuit 52 consisting of a pair of transistors Q42 and Q43, a current output formed at the collector of the transistor Q43 is connected at the node P40 to the fourth current source 54. A current input formed at the base of the transistor Q43 and the base and collector of the transistor Q42 is connected at the node P41 to the third current source 53.

In this configuration, respective emitters of the transistors Q42 and Q43 are connected to the ground line GND and the emitter of the transistor Q43 has the same area as that of the transistor Q42 so that the transistor Q43 can pull in the same current as the current which flows through the transistor Q42. Thus the sixth current mirror circuit 52 can pull in via the node P40 a current $I_{43}$ equal to the current $I_{42}$ supplied via the node P41.

In the output circuit 55, emitters of transistors Q44 and Q45 are connected to the current outputs of the third and fourth current sources 53 and 54, respectively. Bases of transistors Q44 and Q45 are connected in common to a current output of a constant current source 60.

Figure 14A:
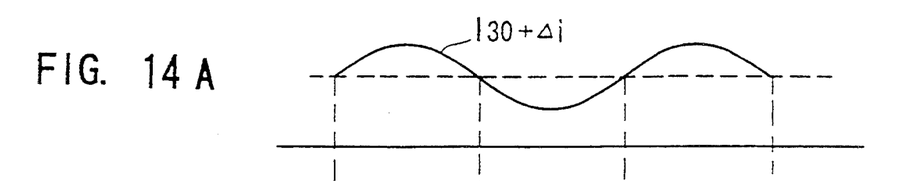
FIGS. 14A to 14G are signal wave form diagrams illustrating wave forms of an input current or an output current which is input to respective input terminals, and output respectively from output terminals of the differential current detecting circuit shown in FIG. 13.
Figure 14B:
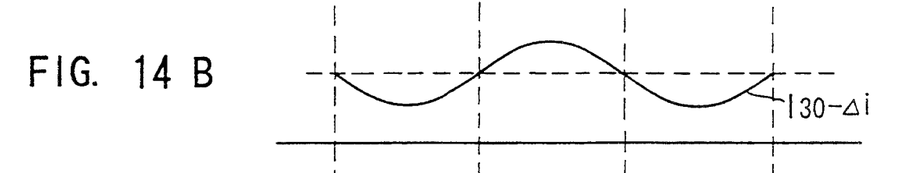

In this configuration, when the third and fourth current sources provide currents having the same period and the same amplitude in opposite phase as shown in FIGS. 14A and 14B, hereinafter, these currents will be referred to as "third output current $I_{30}+\Delta i$" and "fourth output current $I_{30}-\Delta i$", if $\Delta i$ is positive, the third output current $I_{30}+\Delta i$ is larger than the fourth output current $I_{30}-\Delta i$.

If the entire output current $I_{30}-\Delta i$ flowing into the node P40 is supplied to the fifth current mirror circuit 51. The fifth current mirror circuit 51 cannot accept all of the output current $I_{30}+\Delta i$ flowing into the node P41 and thus an overflow current $I_{42}$ flows into the sixth current mirror circuit 52.

As a result, the sixth current mirror circuit 52 pulls in from the node P40 a current $I_{43}$ equal to the current $I_{42}$, which leads to a reduction in the current $I_{40}$ flowing from the node P40 into the fifth current mirror circuit 51. This reduction in current $I_{40}$ leads to a reduction in the current $I_{41}$ pulled in by the fifth current mirror circuit 51 via the node P41.

This results in a further increase in the current $I_{42}$ flowing into the sixth current mirror circuit 52 via the node P41. Thus, eventually, the entire current $I_{30}+\Delta i$ flowing into the node P41 flows into the sixth current mirror circuit 52 and the entire current $I_{30}-\Delta i$ flowing into the node P41 is pulled into the sixth current mirror circuit 52. As a result, the fifth current mirror circuit 51 becomes cut off because there is no current $I_{40}$ supplied to it.

Therefore, in this situation, the current $I_{40}$ flowing into the fifth current mirror circuit via the node P40 can be expressed by the following equation:

$$I_{40}=0 \tag{12}$$

On the other hand, the current $I_{42}$ flowing into the sixth current mirror circuit via the node P41 can be expressed by the following equation:

$$I_{42}=I_{30}+\Delta i \tag{13}$$

Figure 14C:
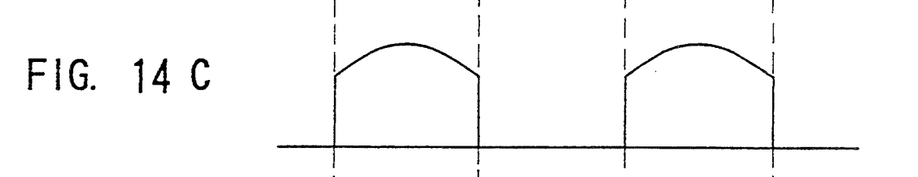
Figure 14D:
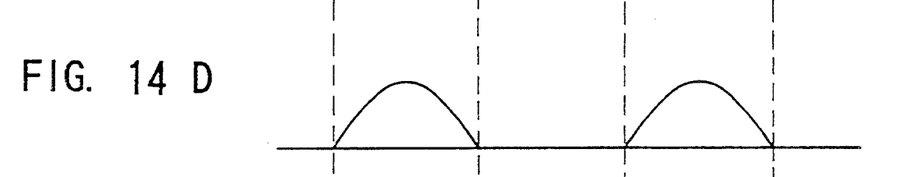

In this situation, the sixth current mirror circuit 52 tries to pull in a current equal to the current $I_{42}$ (equal to $I_{30}+\Delta i$ in this case) shown in FIG. 14C flowing from the node P41. Thus, the sixth current mirror circuit 52 pulls in, from the transistor Q45 via the node P40, a current $I_{46}$ shown in FIG. 14D equal to the difference between the fourth input current $I_{30}-\Delta i$ flowing into the node P40 and the current $I_{42}$ wherein the current $I_{46}$ can be expressed by following equation:

$$I_{46}=I_{42}-(I_{30}-\Delta i)=(I_{30}+\Delta i)-(I_{30}-\Delta i)=2\Delta i \tag{14}$$

Thus, the transistor Q45 provides via its emitter the current $I_{46}$ equal to the difference between the output currents $I_{30}+\Delta i$ and $I_{30}-\Delta i$ provided from the third and fourth current sources, respectively.

In contrast, the fifth current mirror circuit 51, because is cut off, it does not pull current $I_{47}$ from the transistor Q44 and thus the transistor Q44 is maintained cut off.

On the other hand, if $\Delta i$ is negative, the third input current $I_{30}+\Delta i$ flowing into the node P41 is less than the fourth input current $I_{30}-\Delta i$ flowing into the node P40.

Therefore, in this case, the entire current $I_{30}+\Delta i$ flowing into the node P41 is supplied to the sixth current mirror circuit 52. The sixth current mirror circuit 52 cannot accept the entire current $I_{30}-\Delta i$ flowing into the node P40 and thus an overflow current $I_{40}$ flows into the fifth current mirror circuit 51.

As a result, the fifth current mirror circuit 51 pulls in from the node P41 a current $I_{41}$ equal to the current $I_{40}$, which leads to a reduction in the current $I_{42}$ flowing from the node P41 into the sixth current mirror circuit 52. This reduction in $I_{42}$ leads to a reduction in the current $I_{43}$ attracted by the sixth current mirror circuit 52 via the node P40.

This results in an increase in the current $I_{40}$ flowing into the fifth current mirror circuit 51 via the node P40. Thus, eventually, the entire current $I_{30}-\Delta i$ flowing into the node P40 flows into the fifth current mirror circuit 51 and correspondingly the entire third output current $I_{30}+\Delta i$ flowing into the node P41 is pulled into the fifth current mirror circuit 51. As a result, the sixth current mirror circuit 52 becomes cut off because there is no current $I_{42}$ supplied to it.

Therefore, in this situation, the current $I_{40}$ flowing into the fifth current mirror circuit 51 via the node P40 can be expressed by the following equation:

$$I_{40}=I_{30}-\Delta i \tag{15}$$

On the other hand, the current $I_{42}$ flowing into the sixth current mirror circuit 52 via the node P41 can be expressed by the following equation:

$$I_{42}=0 \tag{16}$$

Figure 14E:
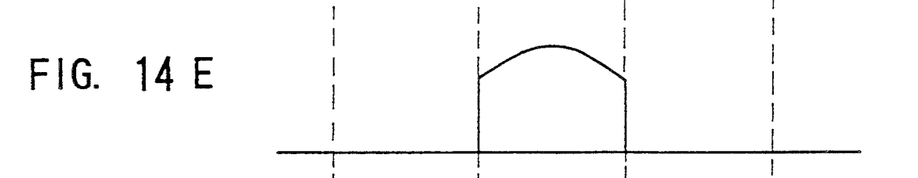
Figure 14F:
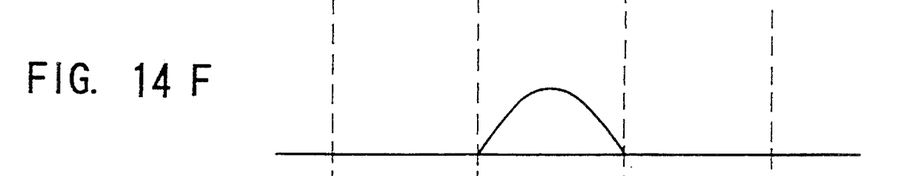
Figure 14G:
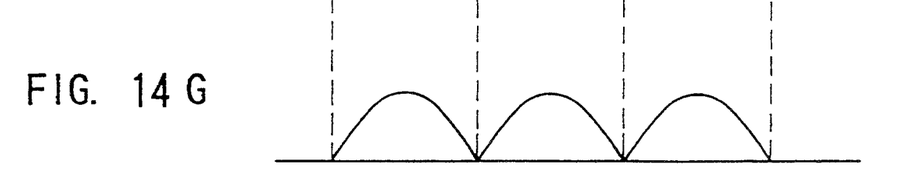

In this situation, the fifth current mirror circuit 51 tries to pull in from the node P41 a current equal to the current $I_{40}$ (equal to $I_{30}-\Delta i$ in this case) shown in FIG. 14E. Thus, the fifth current mirror circuit 51 pulls in from the transistor Q44 via the node P41, a current $I_{47}$ shown in FIG. 14F equal to the difference between the current $I_{40}$ and the third input current $I_{30}+\Delta i$ flowing into the node P41, where the current $I_{47}$ can be expressed by following equation:

$$I_{47}=I_{40}-(I_{30}+\Delta i)-(I_{30}+\Delta i)=-2\Delta i \tag{17}$$

Thus, the transistor Q44 provides via its emitter the current $I_{47}$ equal to the difference between the third and fourth input currents $I_{30}+\Delta i$ and $I_{30}-\Delta i$ provided from the third and fourth current sources, respectively.

In contrast, the sixth current mirror circuit, because is cut off, it does not pull in a current from the transistor Q45 and thus the transistor Q45 is maintained cut off.

With the configuration described above, the current output terminal of the fifth current mirror circuit 51 having a unit current gain, the current input terminal of the sixth current mirror circuit 52, and the emitter of the transistor Q44 are connected to the current output terminal of the third current source 53. The current input terminal of the fifth current mirror circuit 51. The current output terminal of the sixth current mirror 52, and the emitter of the transistor Q45 are connected to the current output of the fourth current source 54. Whereby when the third output current $I_{30}+\Delta i$ provided from the third current source 53 is larger than the fourth output current $I_{30}-\Delta i$ provided from the fourth current source 54, the fifth current mirror circuit 51 becomes cut off and the sixth current mirror circuit 52 is in operation. Thus the transistor Q45 pulls in the current $I_{46}$ corresponding to the difference between the third and fourth output currents $I_{30}+\Delta i$ and $I_{30}-\Delta i$. When the fourth output current $I_{30}-\Delta i$ is larger than the third output current $I_{30}+\Delta i$, the sixth current mirror circuit 52 becomes cut off and the fifth current mirror circuit 51 is in operation and thus the transistor Q44 attracts the current $I_{47}$ corresponding to the difference between the third and fourth output currents $I_{30}+\Delta i$ and $I_{30}-\Delta i$. It is thus possible to obtain half-wave difference currents alternately from the collectors of the transistors Q44 and Q45 independently of each other, where the half-wave difference currents correspond to the difference between the output currents $I_{30}+\Delta i$ and $I_{30}-\Delta i$ provided from the third and fourth current sources.

Thus, it becomes possible to achieve a difference current detecting circuit with a simple configuration capable of alternately providing half-wave difference currents independently of each other in which the half-wave difference currents correspond to the difference between the input currents $I_{30}+\Delta i$ and $I_{30}-\Delta i$.

Furthermore, in the difference current detecting circuit 50, if the collectors of the transistors Q44 and Q45 are connected to each other, it is possible to obtain a composite collector current from the node connected to the collectors of the transistors Q44 and Q45. Thus, it becomes possible to achieve a difference current detecting circuit with a simple configuration capable of providing an absolute value corresponding to the difference between the input currents $I_{30}+\Delta i$ and $I_{30}-\Delta i$.

Furthermore, because the difference current detecting circuit 50 has capabilities of detecting the difference between the input currents $I_{30}+\Delta i$ and $I_{30}-\Delta i$ and deleting the common component $I_{30}$, it is possible to directly supply two signals to the nodes P40 and P41, which leads to easy signal processing, which further makes possible to apply this difference current detecting circuit 50 to a variety of signal processing circuits.

In the third and fourth embodiments described above, NPN transistors are used as the transistors Q33 to Q36 and Q40 to Q46. However, this invention is not limited to that, but transistors of PNP type may also be used for the same purpose.

In the third embodiment, the differential input circuit 41 consisting of a differential pair of transistors is used as the means for providing the difference currents $I_{30}-\Delta i$ and $I_{30}+\Delta i$ to the nodes P31 and P32. However, this invention is not limited to this, but also other various means may be applied for providing the difference currents $I_{30}-\Delta i$ and $I_{30}+\Delta i$ to the nodes P31 and P32. For example, it may be possible to use separate third and fourth current sources 53 and 54 to provide the difference currents $I_{30}-\Delta i$ and $I_{30}+\Delta i$ to the nodes P31 and P32, as in the case of the fourth embodiment.

In the fourth embodiment, the third and fourth current sources 53 and 54 are used to provide the difference currents $I_{30}-\Delta i$ and $I_{30}+\Delta i$ to the nodes P31 and P32. However, this invention is not limited to this, but also may applied other various means for providing the difference currents $I_{30}-\Delta i$ and $I_{30}+\Delta i$ to the nodes P31 and P32. For example, it may be possible to use a differential pair of transistors to provide the difference currents $I_{30}+\Delta i$ and $I_{30}-\Delta i$ to the nodes P31 and P32, as in the case of the third embodiment.

Furthermore, in the fourth embodiment described above, this invention is applied to a difference current detecting circuit 50 which accomplishes its operation by detecting the difference in the currents of the third and fourth current sources 53 and 54 and by rectifying the resulting difference current. However, this invention is not limited to that, but may also be advantageously applied to other fields such as various kinds of rectifying circuits and absolute value detecting circuits.

In the fourth embodiment described above, currents $I_{30}+\Delta i$ and $I_{30}-\Delta i$ in the sinusoidal form are applied to the nodes P30 and P31, respectively, so as to obtain the output of the rectified difference between $I_{30}+\Delta i$ and $I_{30}-\Delta i$. However, this invention is not limited to that, but any signals other than a sinusoidal signal may also be used as the currents applied to the nodes P30 and P31.

In the third embodiment described above, the third and fourth current mirror circuits 42 and 43 are used as a circuit for pulling in a current which is N times larger than the input current. However, this invention is not limited to that, but any circuit configuration may also be used as long as it pulls in a current which is N times larger than the input current.

In the fourth embodiment described above, the fifth and sixth current mirror circuits 51 and 52 are used as a circuit for attracting a current equal to the input current. However, this invention is not limited to that, but any circuit configuration may also be used as long as it attracts a current equal to input current.

As described above, according to this invention, a current output of a third current source of current mirror type having a current gain larger than unity is connected to a current input of a fourth current source of a current mirror type having a current gain larger than unity. A current input of the third current source is connected to a current output of the fourth current source and the node connecting the current output of the third current source to the current input of the fourth current source and the node connecting the current input of the third current source to the current output of the fourth current source provide hysteresis characteristics depending on the current gains of the third and fourth current sources. Thus, by adjusting the current gains of the third and fourth current sources, it is possible to achieve an emitter-coupled logic circuit with a simple configuration which can provide small hysteresis with high reliability.

Further, a current output of a fifth current source is connected to the emitter of a third transistor and a current input of the fifth current mirror circuit is connected to a current output of a sixth current mirror circuit and to the emitter of a fourth transistor. The collectors of the third and fourth transistors provide the difference current output corresponding to the difference between third and fourth currents flowing into the current inputs of the third and fourth current sources. Thus, it is possible to achieve an emitter-coupled logic circuit with a simple configuration which can provide independently the difference current output corresponding to the difference between two currents.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A current source circuit comprising:
a differential current amplifier having a first current mirror circuit and a second current mirror circuit, said differential current amplifier having a first terminal and a second terminal;
said first current mirror circuit having a first output terminal and a first input terminal respectively connected to said first terminal and said second terminal;
said second current mirror circuit having a second input terminal and a second output terminal respectively connected to said first and second terminals; and
a resistance connected between said first and second terminals;
wherein said first terminal is for receiving a first input signal and said second terminal is for receiving a second input signal and said resistor is for receiving a differential current between said first and second input signals.

2. A current source circuit comprising:
a first current mirror circuit having a first input connected to a first terminal and a second input connected to a second terminal;
a second current mirror circuit having a third input connected to said first terminal and a fourth input connected to said second terminal; and
a multiplier circuit comprising a first diode connected transistor, a second diode connected transistor, a third diode connected transistor, and a fourth diode connected transistor, output terminals of said first and second diode connected transistors being commonly connected to said first terminal, output terminals of said third and fourth diode connected transistors being commonly connected to said second terminal, input terminals of said first and third diode connected transistors being commonly connected to receive a first current, and input terminals of said second and fourth diode connected transistors being commonly connected to receive a second current; and an output stage for generating an output signal proportional to a difference between said first current and said second current;

wherein a potential at said first terminal remains constant and equal to a potential at said second terminal.

3. An emitter-coupled logic circuit comprising:

a difference amplifier stage having a first output terminal and a second output terminal, said difference amplifier stage for outputting a current equal in magnitude to a difference between a first current and a second current;

a first current mirror circuit having a first input connected to the first output terminal of said difference amplifier stage and a second input connected to the second output terminal of said difference amplifier stage, said first current mirror circuit having a current flowing through said first input from said first output terminal which has a magnitude a predetermined times larger than a magnitude of a current flowing into said second input from said second output terminal; and a second current mirror circuit having a third input connected to said first output terminal of said difference amplifier stage and a fourth input connected to said second output terminal of said difference amplifier stage, said second current mirror circuit having a current flowing into said fourth input from said second output terminal which has a magnitude said predetermined times larger than a magnitude of a current flowing into said third input from said first output terminal;

wherein when the first current from said first output terminal of said difference amplifier stage is larger than the second current from said second output terminal of said difference amplifier stage, said second current mirror circuit conducts said currents through said third and fourth inputs and said first current mirror circuit becomes cut-off so that no currents flow through said first and second inputs; and when the second current from said second output terminal of said difference amplifier stage is larger than the first current from said first output terminal of said difference amplifier stage, said second current mirror circuit becomes cut-off so that no currents flow through said third and fourth inputs and said first current mirror circuit conducts said currents through said first and second inputs.

4. An emitter-coupled logic circuit for detecting a difference current between a first current and a second current respectively output from first and second output terminals of a current output stage, comprising:

a first current mirror circuit having a first input connected to the first output terminal of said current output stage and a second input connected to the second output terminal of said current output stage, said first current mirror circuit having a current flowing into said first input from said first output terminal which is equal in magnitude to a current flowing into said second input from said second output terminal;

a second current mirror circuit having a third input connected to the first output terminal of said current output stage and a fourth input connected to the second output terminal of said current output stage, said second current mirror circuit having a current flowing into said third input from said first output terminal which is equal in magnitude to a current flowing into said fourth input from said second output terminal;

a first transistor having an emitter connected to said first output terminal of said current output stage; and a second transistor having an emitter connected to said second output terminal of said current output stage;

wherein when said first current from said current output stage becomes larger than said second current from said current output stage, said magnitude of said currents flowing through said first and second inputs of said first current mirror circuit are equal to zero and a current having a magnitude equal to a difference between said first current and said second current is supplied from said second transistor to said second output terminal; and when said second current from said current output stage becomes larger than said first current from said current output stage, said magnitude of said currents flowing through said third and fourth inputs of said second current mirror circuit are equal to zero and a current having a magnitude equal to a difference between said second current and said first current is supplied from said first transistor to said first output terminal.

5. An emitter-coupled logic circuit according to claim 4, wherein collectors of said first and second transistors are commonly connected to a third output terminal and wherein a differential current flows at said third output terminal equal in magnitude to an absolute value of said difference between said first current and said second current.

6. The current source circuit as set forth in claim 1, further comprising a first transistor having a base connected to said first terminal and an emitter connected to ground and a second transistor having a base connected to said second terminal and an emitter connected to ground;

wherein an amount of current flowing into a collector of said first transistor differs from an amount of current flowing into a collector of said second transistor by an amount proportional to said differential current.

7. The current source as set forth in claim 1, wherein:

said first current mirror circuit comprises a first transistor having a collector connected to said first terminal, a base connected to said second terminal, and an emitter connected to ground and a second transistor having a base and a collector connected to said second terminal and an emitter connected to ground; and said second current mirror circuit comprises a third transistor having a collector connected to said second terminal, a base connected to said first terminal, and an emitter connected to ground and a fourth transistor having a base and a collector connected to said first terminal and an emitter connected to ground.

8. The current source circuit as set forth in claim 1, wherein an amount of current flowing through said first current mirror circuit is equal to an amount of current flowing through said second current mirror circuit.

9. The current source as set forth in claim 2, wherein a current flowing into said first and second current mirror circuits at said first terminal is equal in magnitude to a current flowing into said first and second current mirror circuits at said second terminal.

* * * * *